United States Patent [19]

Kopp et al.

[11] Patent Number: 5,369,549
[45] Date of Patent: Nov. 29, 1994

[54] CASING FOR A DEVICE

[75] Inventors: Siegfried Kopp, Renningen; Juergen Haeberle; Johannes Mahn, both of Boeblingen; Tim Schwegler, Pforzheim; Malte Schlueter, Calw, all of Germany

[73] Assignee: Hewlett-Packard Company, Palo Alto, Calif.

[21] Appl. No.: 157,219

[22] Filed: Nov. 23, 1993

[30] Foreign Application Priority Data

Dec. 16, 1992 [DE] Germany ............ 9217174[U]

[51] Int. Cl.⁵ .............................................. H05K 5/00
[52] U.S. Cl. ............................ 361/679; 220/4.21; 220/4.24; 220/324; 312/223.2; 312/263; 361/724
[58] Field of Search ............... 200/303, 307; 220/4.21, 220/4.24, 4.33, 356, 357, 684, 693; 312/257.1, 223.1, 223.2, 263; 361/651, 679, 724, 726, 829

[56] References Cited

U.S. PATENT DOCUMENTS

| Re. 14,294 | 5/1917 | Cochrane | 220/4.33 |
| 2,999,611 | 9/1961 | Paulson | 220/4.24 |
| 3,315,639 | 4/1967 | Close | 220/4.33 |
| 3,901,572 | 8/1975 | Litchfield | 312/263 |
| 3,966,285 | 6/1976 | Porch et al. | 220/4.33 |
| 4,045,104 | 8/1977 | Peterson | 312/263 |
| 4,690,286 | 9/1987 | Horne et al. | 361/724 |
| 4,991,328 | 2/1991 | Rousseau et al. | 40/155 |
| 5,111,362 | 5/1992 | Flamm et al. | 220/4.24 |
| 5,248,193 | 9/1993 | Schlemmer | 312/223.2 |

FOREIGN PATENT DOCUMENTS

| 2048383 | 4/1972 | Germany | 220/4.33 |
| 2538340 | 12/1976 | Germany | 361/679 |
| 7919933 | 10/1979 | Germany . | |
| 8005618 | 6/1980 | Germany . | |
| 9217831 | 12/1992 | Germany . | |
| 2295119 | 12/1987 | Japan | 312/223.2 |

Primary Examiner—Gregory D. Thompson

[57] ABSTRACT

A device casing includes at least two casing parts, which are held together by corner parts that are pushed over the corners of the casing parts. Locking elements are provided to connect the corner parts with the casing parts. The locking elements prevent the corner parts coming away from the casing once assembled.

9 Claims, 4 Drawing Sheets

CASING FOR A DEVICE

The invention relates to a casing for a device, for instance an electronic device, in accordance with the preamble to claim 1. A casing of this type is used to accommodate and to protect the components, such as printed circuit boards, data reading devices, loudspeakers, fans, etc. located in the device.

The casings normally in use today consist of a number of individual components joined together by means of screws or rivets. This means that tools are required to assemble the casing, for example a screwdriver or rivet punch. This makes assembly of the casing comparatively complicated and costly.

Relative to the prior art, the objective of the invention is to create a casing in accordance with the preamble to claim I which allows very simple assembly without tools.

This object of the invention is achieved by the characterizing features described in claim 1.

The casing according to the invention has at least two casing parts, which can be put together and are held together by corner parts which are pushed over the corners of the casing parts. Locking elements are provided to connect the corner parts with the casing parts. These locking elements prevent the corner parts coming away from the casing once assembled. In order to assemble the casing in accordance with this invention, the assembly person initially places the two or more parts of the casing together, then pushes the corner parts over the corners of the assembled casing and joins the locking elements to the casing. Only a few actions are, thus, necessary to assemble the casing and, in particular, no tool is required.

In a preferred embodiment of the invention the locking elements take the form of projections within each corner part and the casing parts have corresponding apertures to accommodate these projections. The corner parts are, thus, fastened by simply snapping the corner parts over the corners of the casing parts. This ensures a very rapid and secure assembly. The projections within the corner part can have the form of a simple spigot with rectangular or circular cross-sections; in particular, this invention does not require complicated designs of hooks which are difficult to manufacture. The snap-on corners in accordance with this invention ensure a stable joint, ensuring that the casing can no longer be dismantled by hand using normal force. However, it is very easy to dismantle the casing using a tool, for example a screwdriver, by levering the snap-on corner away from the casing.

The snap-on corners, including the projections, are preferably manufactured by injection moulding of plastic. A part of this type is simple to manufacture at very low cost. At least one of the snap-on corners can simultaneously include an integrated plastic front panel; a part of this type can also be simply and cheaply manufactured from plastic by injection moulding. A separate front panel for the device is, thus, not necessary, which is also contributing to a low-cost casing and a short assembly time. In accordance with a further embodiment of the invention, at least one of the snap-on corners can simultaneously be designed as a foot for the device. In this way, the device can, for example also be stood upright. Furthermore, the device can be given many types of coloured design without additional cost by appropriate pigmentation of the snap-on corners or the integrated front panel.

In one embodiment, the two or more casing parts are manufactured from sheet metal and the lower part incorporates an off-set running around its top edge corresponding to the sheet thickness of the upper part, so that the upper part can easily be placed on the lower part.

The following advantages, in addition to those already referred to, thus arise for the invention: The casing parts can be simply and cheaply manufactured, for example from sheet metal. The tools required for manufacture are very simple. There are practically no tolerance problems in manufacture as, where sheet metal is used for the manufacture of the upper and lower parts of the casing, for example, only a few bends are required. The upper and lower part can be simply pushed into one another without a tool. Fasteners such as bolts, rivets or hooks are not required. Assembly and disassembly can, thus, be completed quickly and cheaply. Assembly can be carried out by anyone without further knowledge or learning time, since the assembly concept using the snap-on corners is practically self-explanatory.

Embodiments of the invention will be described below on the basis of the drawing.

FIG. 1 shows a casing in accordance with the invention which can be used, for example, to accommodate the components of a data processing device. A data processing device of this type, for example a workstation, typically comprises a processor, a diskette read/write device, memory and associated control and power supply circuitry.

The casing comprises an upper part 1 and a lower part 2 both fabricated from sheet metal. Said upper part 1 and the lower part 2 are fastened together by the plastic corners 3, 4, 5 and 6. Said plastic corners 3 to 6 are snapped on to the upper part 1 and the lower part 2. Said plastic corners 3 to 6 are, thus, also designated snap-on corners. Details regarding the jointing of snap-on corners 3 to 6 with upper part 1 and the lower part 2 will be described in conjunction with FIG. 2.

Figure 1:
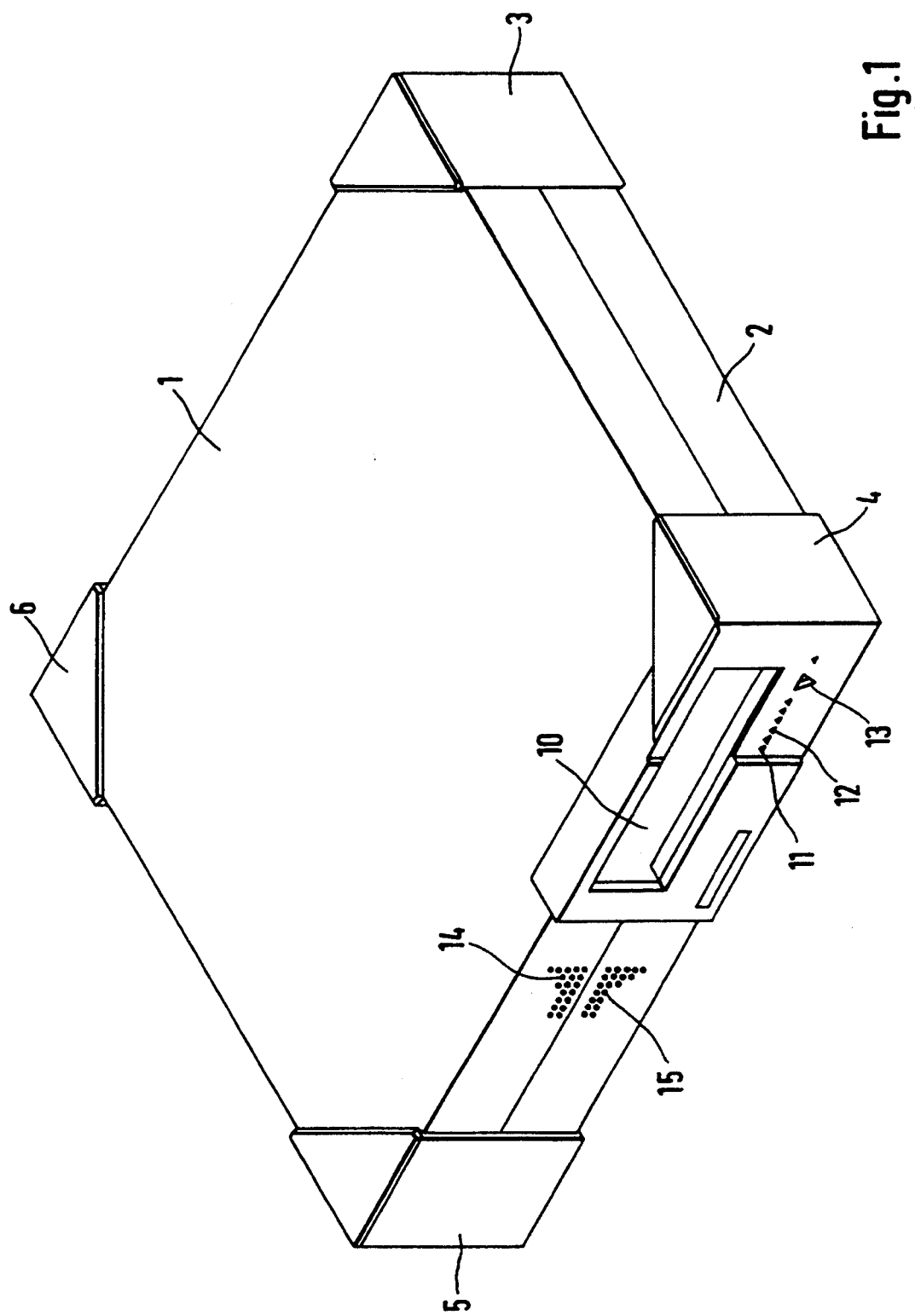
FIG. 1 shows a casing in accordance with a first embodiment of the invention in a perspective representation.

Snap-on corner 4 illustrated in FIG. 1 is simultaneously also designed as a front panel for the data processing device. The front panel includes an aperture 10 for the introduction of a diskette into a read/write device accommodated in the casing. Furthermore, the front panel has penetrations 11, 12 in which optical display devices, for example LEDs, can be inserted to indicate the operating state of the data processing device. In addition, an aperture 13 is provided in the front panel 4 to accommodate the mains switch of the data processing device. Apertures 14 and 15 are provided in the upper part 1 and in the lower part 2 behind which a loudspeaker can be mounted inside the casing. If necessary, ventilation slots can also be provided in the casing. The plastic corners 3, 5. 6 and the plastic corner 4 with integral front panel are simply snapped on by hand by the operator in the assembly process. No tool is required for this.

Figure 2:
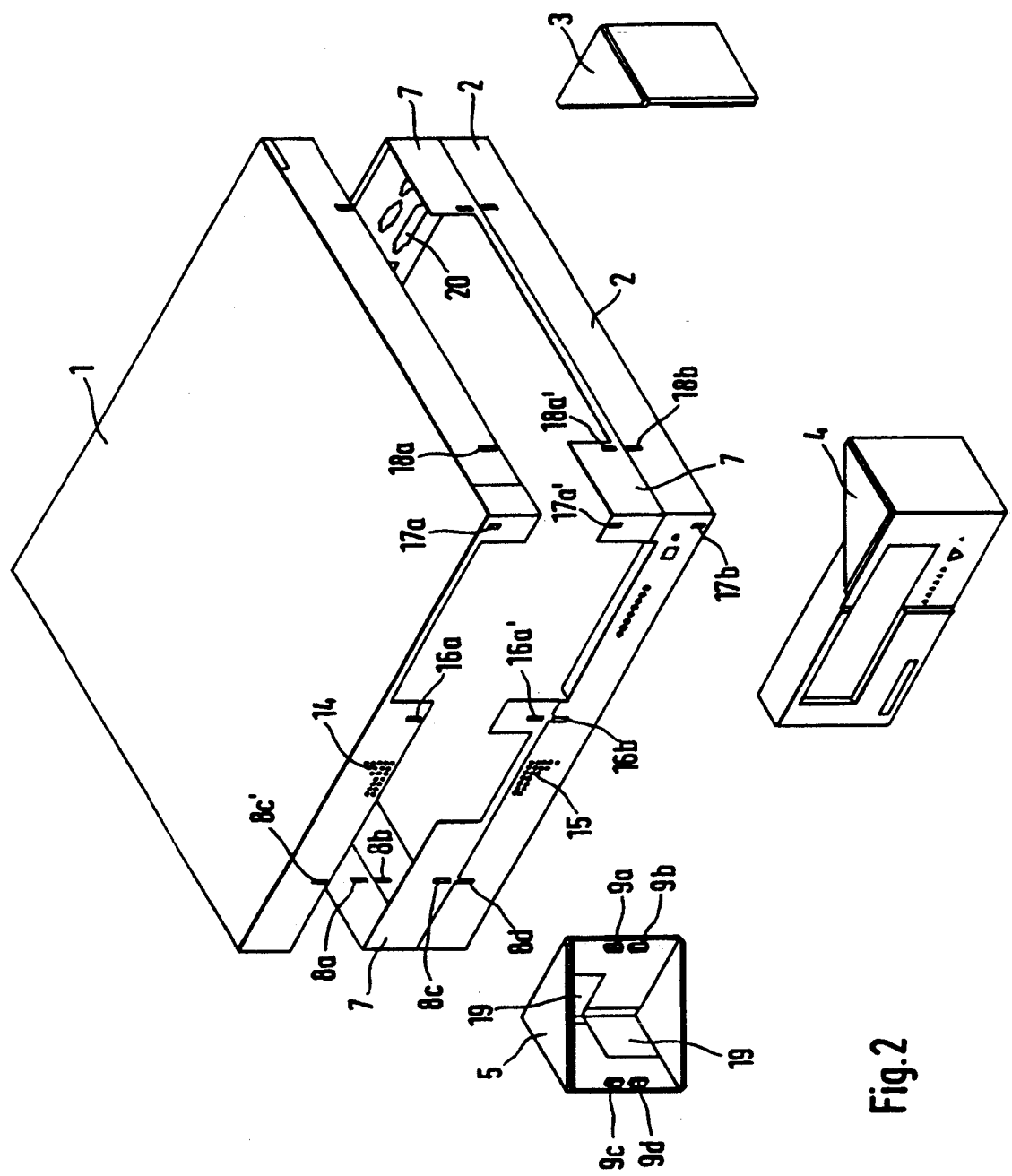
FIG. 2 shows the casing in accordance with FIG. 1 in the dismantled condition.

FIG. 2 shows the individual parts of the casing in accordance with FIG. 1 in the dismantled condition. The upper part 1 and the lower part 2 are both fabricated from a metal sheet by stamping and bending. Both parts have essentially the same length and width so that they form a cuboid casing when joined. Lower part 2 alone has an edge 7 running around its upper area which is set back from its lower area by the amount of the sheet thickness of the upper part 1. This ensures that the upper part 1 can be pressed easily on the lower part 2 during assembly of the casing and that the joined parts have a flush surface at the sides.

As illustrated in FIG. 2, upper part 1 and lower part 2 each have a series of apertures in the corner area, for example the apertures indicated by the reference symbols 8a, 8b, 8c, 8c' and 8d. When the upper part 1 is placed over the lower part 2, the aperture 8c' in the upper part coincides with the aperture 8c in the lower part. There are thus four apertures in the corner of the casing into which the corresponding projections 9a–d of plastic corner 5 project in the assembled condition. In order to provide a better view, a plastic corner 5 in FIG. 2 is rotated by comparison with the assembled condition shown in FIG. 1 so that the projections 9a–d can be seen. In the assembled condition, projection 9a penetrates into aperture 8a, projection 9b into aperture 8b, projection 9c into aperture 8c (and 8c') and projection 9d into aperture 8d. Upper part 1 has a further aperture in the corner area which coincides with aperture 8a in the lower part 2 when the upper part is placed onto the lower part; this aperture is concealed in the perspective representation of FIG. 2 by the upper surface of the casing.

The remaining three casing corners 3, 4 and 6 are joined to the upper and lower parts in the same way as corner 5. Corners 3 and 6 have the same construction as corner 5, each having a pair of projections on each corner side which project into the corresponding apertures in the upper part and lower part. For the sake of clarity, corner 6 has been omitted from FIG. 2. Corner 4, with the integral front panel, has two pairs of projections in the front area (not illustrated), which penetrate into aperture 16a, a' and 16b and 17a, a' and 17b, and pair of projections (not illustrated) in the side area which penetrate into apertures 18a, a' and 18b.

In order to assemble the casing in accordance with the invention, upper part 1 is initially placed onto lower part 2. One of the plastic corners with the projections on one side (e.g. projections 9a and 9b of corner 5) is then inserted in the corresponding apertures (e.g. aperture 8a and 8b) of the metal casing 1, 2. The assembler then exerts light pressure on the corner until the projections on the other side of the corner also snap into the corresponding apertures. The procedure is identical for the remaining snap-on corners. Assembly can be completed without the use of any tools and without fasteners such as bolts, rivets or hooks. The force required to snap the corners on is low. Assembly can, thus, be completed simply rapidly and cheaply.

The snap-on corners can further be provided with cut-out or depressions 19 on their inside. These cut-outs are provided for the event that the upper part 1 and/or lower part 2 have a double layer of sheet in the corner area, as can be seen in the region of aperture 17a. The cut-outs insure that the snap-on corners lie snugly on the upper and lower part, despite the double thickness of sheet. As is also shown in FIG. 2, the rear side of the lower part 2 also has some apertures 20 which can be used to accommodate connectors or sockets.

In the embodiment of the invention illustrated, snap-on corners 3, 4, 5, and 6 including the projections 9a–d consist of an unbreakable, substantially non-deformable plastic, for example a polycarbonate. Said snap-on corners have a certain degree of elasticity in the side areas at which the projections 9a and 9b and 9c and 9d are found, so that it remains possible to lever the corners off using a tool. Selection of the height of the projections 9a–d of the snap-on corners also takes into consideration the resilience properties of the plastic material so that it remains possible to remove the corners using a tool. In order to dismantle the casing, a flat tool, for example a screwdriver, is inserted between the sheet metal casing 1, 2 and the plastic corner, preferably between 9a and 9b or 9c and 9d. By lifting the tool, the side area of the corner with the projections is lifted slightly from the sheet metal casing, causing the projections to slip out of the corresponding apertures in the sheet metal parts 1, 2 and the corner then to spring away from the sheet metal casing 1, 2. In order to assist in removal of the snap-on corners, the sheet metal parts 1, 2 can have a depression, at least in the region of the apertures for the projections, thus making it easier to introduce a tool between the sheet metal part and the snap-on corner. As an alternative or in addition to this, the snap-on corners could also have a cut-out in the region of the projections, for example between projections 9a and 9b to ease introduction of a tool.

The assemblies inside the casing in accordance with this invention, for instance the components of a data processing device such as PCBs, memory, can be secured to the upper part 1 or the lower part 2. As an alternative to this, components of this type could also be positively bedded in a chassis made from an elastic plastic material, without the components having to be fastened to the sheet metal parts 1 or 2. Expanded polypropylene is a suitable plastic for the material serving this purpose, the plastic chassis in this case completely filling the inside of the sheet metal casing 1, 2. Because of the elasticity of the plastic used for the chassis, a force will act which counteracts the compressive force exerted by the snap-on corners pressing the upper part 1 against the lower part 2. A play-free connection between upper part 1 and lower part 2 is achieved in this way.

Very good screening of the components within the casing against electro-magnetic interference is ensured since a metal casing consisting of the upper part 1 and the lower part 2 is used in the embodiment of the invention illustrated in FIG. 1 and FIG. 2. It is, however, not a requisite feature of the invention that the upper part and the lower part consist of metal. Plastic parts which are provided with an electrically conductive coating could also be used.

Figure 3:
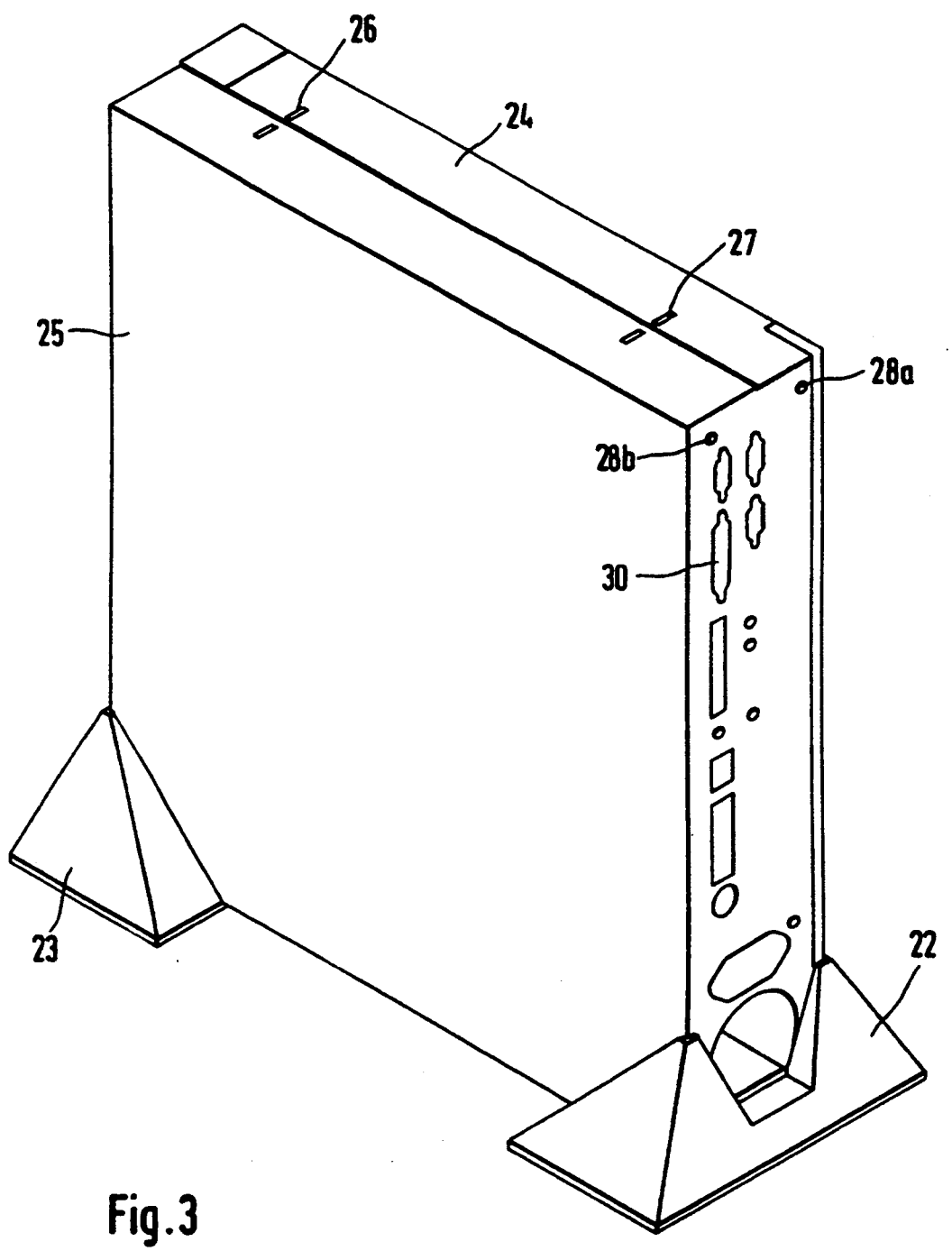
FIG. 3 shows a second embodiment of the invention in a perspective representation.

FIG. 3 shows a second embodiment of a casing in accordance with this invention. In the case of this embodiment, the snap-on corners 22 and 23 are simultaneously designed to be feet for the casing. The casing can, thus, be stood on its edge. The two casing parts 24 and 25 are preferably fabricated from sheet metal. In the fully assembled condition, snap-on corners are also found on the upper side of the casing. These have been omitted here for the sake of clarity; however, the apertures 26 and 27 and 28a and 28b can been seen in which the projections of the snap-on corners penetrate. The reverse side of the casing has a series of apertures, for example aperture 30, to accommodate connectors or sockets.

Figure 4:
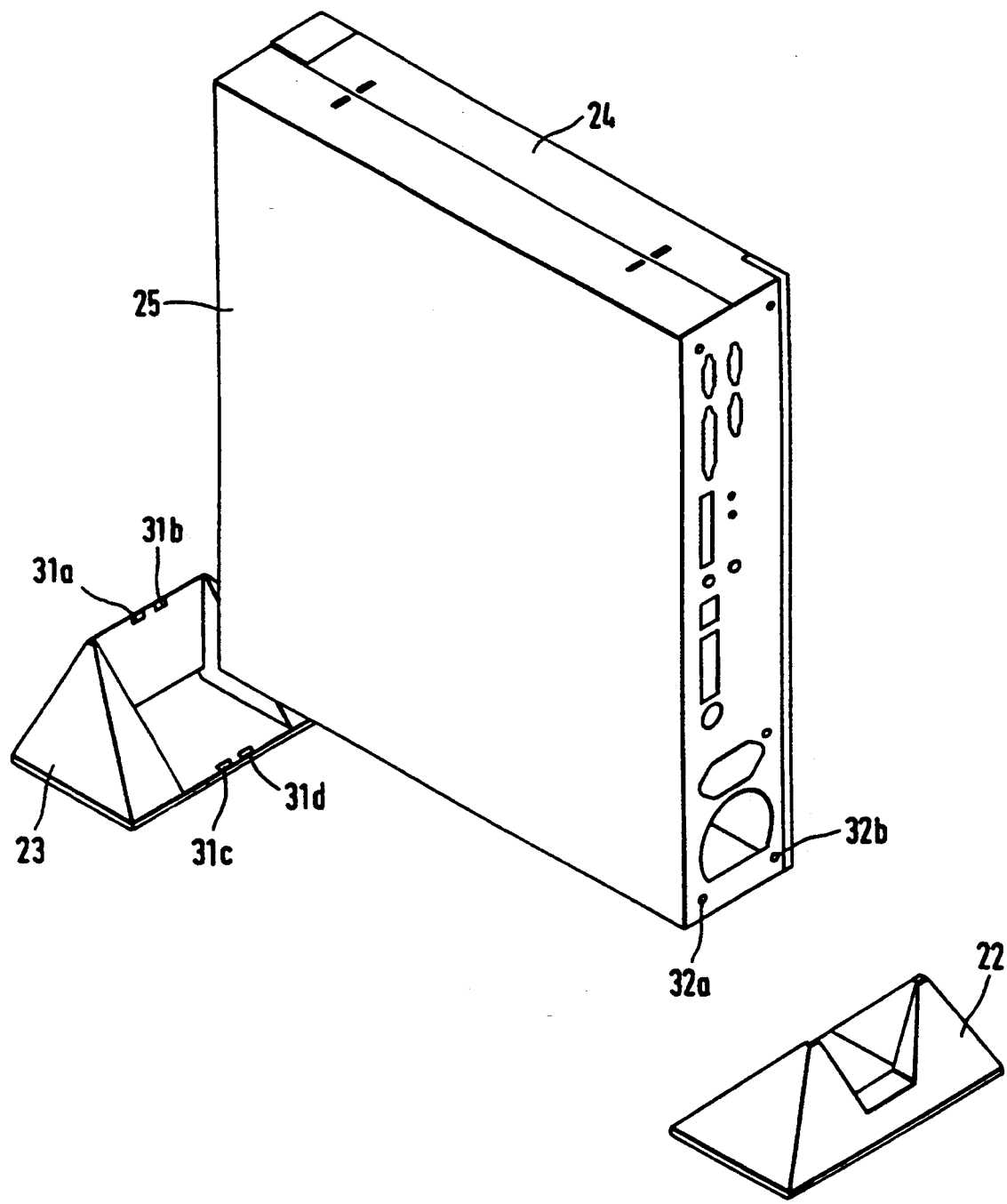
FIG. 4 shows the casing in accordance with FIG. 3 in the dismantled condition.

FIG. 4 shows the casing in accordance with FIG. 3 with the snap-on corners 22 and 23 removed. The projections 31a, 31b, 31c and 31d can be seen on snap-on corner 23, these are snapped into the corresponding aperture of casing parts 24, 25 on assembly. Apertures 32a and 32b, into which the corresponding projections of snap-on corner 22 are snapped on assembly, can also be seen.

A great number of further embodiments of the invention are possible in addition to the embodiments described above. It is not necessary that the projections on the snap-on corners, for example, be located on the two side areas of the snap-on corners as shown in FIG. 2. They could also be located in the top surface and bottom surface of a snap-on corner, in which case corresponding openings would be provided in the top surface of upper part 1 and the base surface of lower part 2 (in FIG. 2 both are drawn horizontally). There is also a large number of possibilities with regard to the number of projections per snap-on corner. For instance, instead of the two projections shown in FIG. 2 on the two side parts of the snap-on corner, there could also be just a single projection. Or more than two projections could be provided on one surface of a snap-on corner, as is indeed also the case on the front panel 4 illustrated in FIG. 2. There are also a wide variety of possibilities with regard to the shape of the projections: they can have a rectangular cross section as shown in FIG. 2, or they can also be designed in the form of a cylinder or have another form permitting them to snap into corresponding apertures in the casing parts 1, 2. The external form of the snap-on corners can also be varied: for example the side area of the snap-on corner illustrated in FIG. 2 on the rear side of the casing 1, 2 could be removed in part to allow access to a connector aperture 20 located in the corner area.

It is clear that the casing in accordance with the said invention cannot only be used for electronic devices such as computers or electronic metering devices, but that it can also be used for other types of devices requiring a casing, such as optical metering devices.

We claim:

1. A casing for a device that includes functionally interconnected components, said device disposed within said casing, said casing comprising:
   a first casing part and a second casing part, joined to create a three dimensional polygonal shape having at least a pair of opposed major surfaces joined by edges which intersect at corners that extend between said opposed major surfaces; and
   a rigid corner part positioned at each of a plurality of said corners, each said rigid corner part having first surfaces which cover both edges which intersect at a corner, each of said first surfaces of each rigid corner part including integral locking elements that interact with and join to said first and second casing parts so as to enable each said rigid corner part to join together said first and second casing parts.

2. The casing as recited in claim 1 wherein each rigid corner part further has second surfaces that cover portions of both said pair of opposed major surfaces.

3. The casing as recited in claim 2, wherein said locking elements in each rigid corner part take the form of projections that are directed inwardly from each corner part and towards said casing parts, said first casing part and second casing part having correspondingly located apertures to accommodate said projections.

4. The casing as recited in claim 2 wherein each said rigid corner part takes a form of a cut-off cube corner that has been severed by an intersecting plane, said intersecting plane running parallel to an edge at said cube corner.

5. The casing as recited in claim 1, wherein at least one said rigid corner part includes a projection that extends along an edge created by a joinder of said casing parts, said projection creating an integrated front panel for said functionally interconnected components within said casing.

6. The casing as recited in claim 1 wherein at least one said rigid corner part includes projection means which form a foot for supporting said casing.

7. The casing as recited in claim 1, wherein a first casing part is provided with a setback region that is coextensive with a portion thereof which joins to said second casing part, said second casing part thereby being enabled to mate with said first casing part by a portion thereof which overlaps said setback portion.

8. The casing as recited in claim 3, wherein each said rigid corner part and projections associated therewith is formed as an integrated, molded plastic part.

9. The casing as recited in claim 7, wherein each of said projections interacts with said apertures in said first and second casing parts via a flexible interference fit, whereby each said rigid corner part is removable from said first casing part and said second casing part by an implement inserted between one said rigid corner part and said first casing part or said second casing part.

* * * * *